United States Patent [19]

Mazzali

[11] Patent Number: 5,028,979

[45] Date of Patent: Jul. 2, 1991

[54] TABLE CLOTH MATRIX OF EPROM MEMORY CELLS WITH BURIED JUNCTIONS, INDIVIDUALLY ACCESSIBLE BY A TRADITIONAL DECODER

[75] Inventor: Stefano Mazzali, Milan, Italy

[73] Assignee: SGS-Thomson Microelectronics, s.r.l., Milan, Italy

[21] Appl. No.: 488,148

[22] Filed: Mar. 5, 1990

[30] Foreign Application Priority Data

Mar. 15, 1989 [IT]  Italy ............................... 19777 A/89

[51] Int. Cl.[5] .................... H01L 27/10; H01L 27/15
[52] U.S. Cl. ...................................... 357/45; 357/23.5
[58] Field of Search ................... 357/54, 23.5, 45, 44, 357/41, 23.4

[56] References Cited

U.S. PATENT DOCUMENTS

| | | | |
|---|---|---|---|
| 4,342,099 | 7/1982 | Kuo | 365/104 |
| 4,376,947 | 3/1983 | Chiu et al. | 357/23 |
| 4,451,904 | 5/1984 | Sugiura et al. | 365/182 |
| 4,750,024 | 6/1988 | Schreck | 357/23.5 |
| 4,868,629 | 9/1989 | Eitan | 357/45 |
| 4,892,840 | 1/1990 | Esquivel et al. | 437/52 |

FOREIGN PATENT DOCUMENTS

| | | | |
|---|---|---|---|
| 57-28364 | 2/1982 | Japan | 357/23 |
| 63-281469 | 11/1988 | Japan | 357/23.5 |

Primary Examiner—Jerome Jackson, Jr.
Assistant Examiner—D. Monin
Attorney, Agent, or Firm—Sixbey, Friedman, Leedom & Ferguson

[57] ABSTRACT

The table cloth matrix comprises a semiconductor substrate, wherein there are contained in deep layers, under strips of field oxide, source lines and drain lines parallel to one another, areas of floating gate connecting said source lines and drain lines and control gate lines, parallel to one another and perpendicular to said source lines and drain lines, in a condition superimposed over said floating gate areas. Each source line is alternated with two drain lines separated by an insulation zone, so that each drain line is associated with a single row of matrix cells.

2 Claims, 3 Drawing Sheets

TABLE CLOTH MATRIX OF EPROM MEMORY CELLS WITH BURIED JUNCTIONS, INDIVIDUALLY ACCESSIBLE BY A TRADITIONAL DECODER

DESCRIPTION

The present invention relates to a table cloth matrix of EPROM memory cells with buried junctions, individually accessible by a traditional decoder.

In the manufacture of memory matrices one of the fundamental problems is to increase the density of the cells as much as possible, so as to improve performance and to exploit the available area better. This implies the search for and the use of increasingly advanced technolgies, particularly in the area of photolithography, wherein the definition of smaller and smaller structures is required, down to submicrometric dimensions. In spite of such technolgies it is more and more difficult to compact the devices, so that research is now oriented towards new structures with which to overcome these problems.

In the field of EPROM memory cells a step ahead in this sense has been made with the accomplishment of the so-called "table cloth" matrix wherein two groups of source lines and one group of drain lines parallel and alternated with one another are intersected perpendicularly by control gate lines parallel to one another, while floating gate areas are interposed between said source and drain lines beneath said control gate lines.

The new configuration, better described in the Italian patent application No. 23479 A/84 dated Nov. 7, 1984, which corresponds to U.S. Pat. No. 4,792,925 assigned to the assignee of the present application, has proved advantageous as regards dimensional problems, attaining levels of miniaturization, cell density and compactness of considerable interest. The decoder required to access the individual cells has, on the other hand, proved very complex, as it is necessary to distinguish one group of source lines from the other, as well as to address the appropriate drain and control gate lines.

Another problem of this structure is represented by the low capacitative coupling between the control gate and the floating gate of each cell, due to the fact that the coupling area between the two gates is practically equal to that between the floating gate and the substrate. This implies a value of the capacitative ratio which is too low to obtain good writing characteristics of the cell.

A solution for improving said capacitative ratio is proposed in the Italian patent application No. 22848 A/88 dated Dec. 5 1988, which corresponds to U.S. Pat. No. 444,796 filed Dec. 1, 1988 and assigned to the assignee of the present application.

In this patent application there is again provided a cell matrix having a "table cloth" structure which comprises field oxide areas formed on the cell substrate perpendicularly to the source and drain lines and lateral fins of the floating gate areas and of the control gate lines superimposed over said field oxide areas. In this cell, however, it is necessary to have a decoder, typical of the "table cloth" structure, which is more complicated than the traditional one. In addition, it is not possible to compact this structure further, to keep the minimum distance between the control gate lines.

Some time ago a "table cloth" matrix was also accomplished based on drain and source lines alternated with one another, included in buried layers of the substrate, with superimposed field oxide, on which there rest lateral fins of the floating gate. In this way, through the field oxide, the floating gate is separated from the drain or the source lines, while thanks to the above mentioned lateral fins an extensive coupling area is ensured between the floating gate and the control gate and a consequent better capacitative ratio.

The performance of this latter structure is in practice fairly poor, particularly for the long time necessary to access the individual cell, due to the fact that a same drain line is common to two rows of cells, so that to address an individual cell it is necessary to suitably command not only a drain line and a control gate but also one of the two source lines on each side of the above drain line. This type of a more complicated decoder requires more intricate, and thus larger, circuitry, something which is clearly to be avoided.

The object of the present invention is to accomplish a matrix with a "table cloth" structure with buried junctions which, in addition to improving the capacitative ratio, will also allow the use of a traditional-type decoder, with a consequent shorter access time, less circuit complexity and higher cell density.

According to the invention such object is attained with a table cloth matrix of EPROM memory cells, comprising source lines and drain lines parallel and alternated with one another, inserted in buried layers of a substrate under strips of field oxide, floating gate areas connecting said source lines and drain lines with lateral fins superimposed over said strips of field oxide, and control gate lines parallel to one another and perpendicular to said source lines and drain lines in a condition superimposed over said floating gate areas, so as to define a plurality of rows of memory cells parallel to one another, characterized in that each source line is alternated with a pair of drain lines separated by an insulation area obtained in the substrate, so that each drain line is associated with one and only one of said rows of cells.

It appears evident that, since each drain line is assigned to a single row of cells, and not to two rows as in the traditional technique, it is possible to access one individual cell with a traditional, faster and simpler decoder, and thus with a lower utilization of space. In addition, the presence of field oxide superimposed over the source and drain lines, together with the extensive contact surface between floating gate and control gate, allows an excellent capacitative coupling.

The characteristics and the advantages of the present invention shall be made more evident by the following detailed description of one of its preferred embodiments, illustrated as a non-limiting example in the following drawings, wherein.

Figure 1:
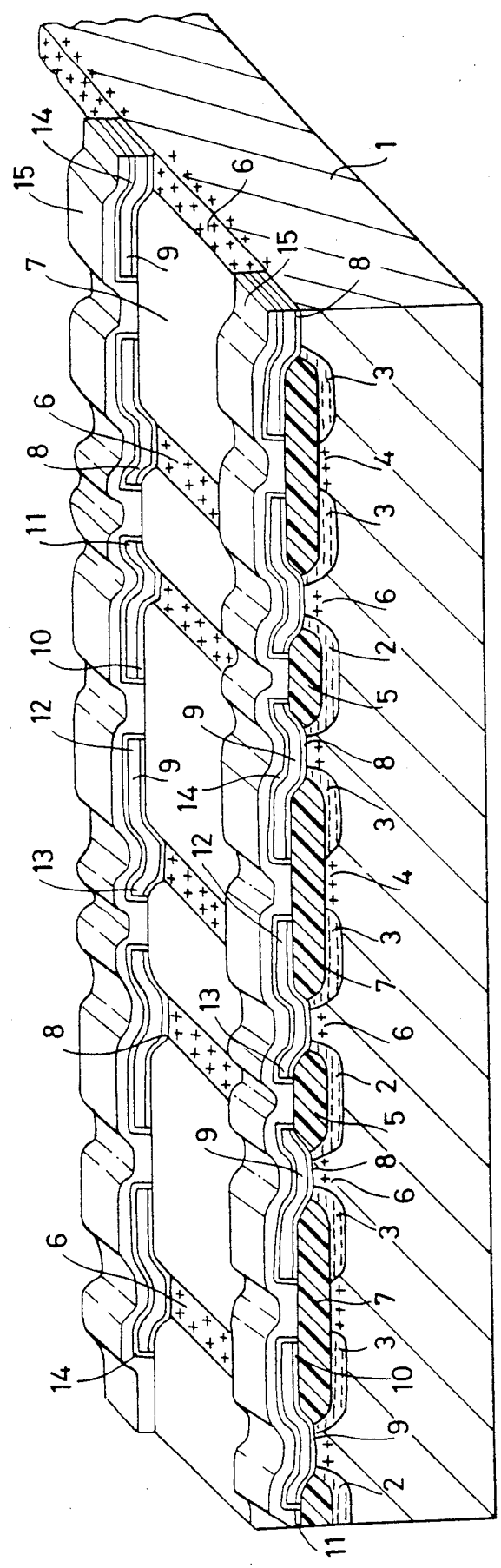
FIG. 1 is a perspective cross-section of a portion of a matrix of EPROM memory cells according to the invention.

The matrix shown in the drawings, of the so-called "table cloth" type, comprises a silicon substrate 1, wherein there are obtained in buried layers parallel source lines 2, alternated with pairs of parallel drain lines 3. The two drain lines 3 are separated by insulation strips 4, while insulation strips 6 are provided at the sides of the drain lines 2.

Above each source line 2 there is grown a thick strip of field oxide 5; similarly, on each pair of adjacent drain lines 3 there is grown a thick strip of field oxide 7, more extensive than the strips of field oxide 5 (FIG. 1).

Said strips of field oxide 5 and 7 are alternated with said insulation strips 4 and 6.

Figure 3:
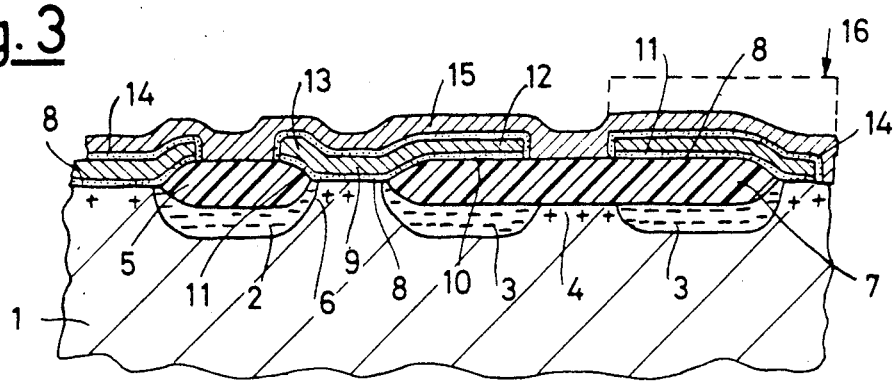
FIGS. 3, 4, 5, 6 and 7 show enlarged details of said matrix in cross-section taken along the lines III—III, IV—IV, V—V-VI—VI and VII—VII of FIG. 2.
Figure 4:
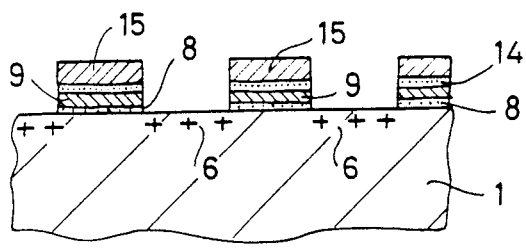
Figure 5:
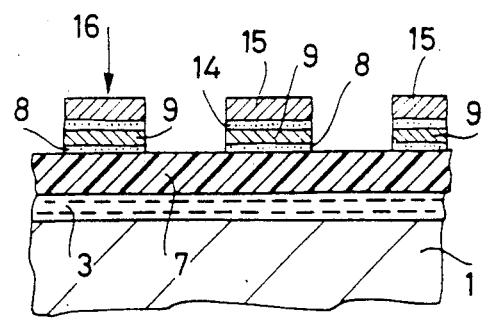
Figure 6:
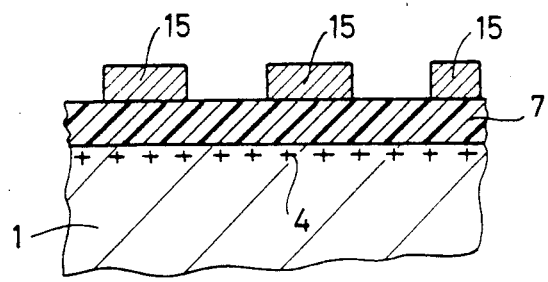
Figure 7:
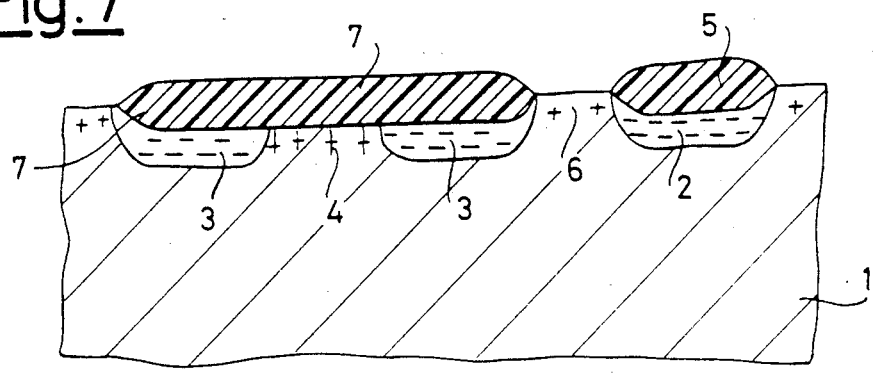

Between each source line 2 and drain line 3 (constituting the so-called "bit-lines") there are defined gate oxide areas 8, partially superimposed over said field oxide strips 5 and 7 by means of asymmetrical fins 10 and 11 (FIG. 3), the larger fin 10 being superimposed over the corresponding oxide strip 7, the smaller fin 11 being superimposed over oxide strip 5.

The oxide areas 8 are each coated by a floating gate area 9, say of polysilicon, with asymmetrical fins 12 and 13 (FIG. 3) superimposed over fins 10 and 11, respectively, of the underlying gate oxide areas 8.

Above each group formed by the superimposed areas of gate oxide 8 and floating gate 9 there is deposited a layer of dielectric oxide 14.

Lastly over each "sandwich" formed by oxide area 8, floating gate 9, dielectric 9 there are deposited, aligned with this "sandwich", control gate lines 15 (the so-called "word lines"), perpendicular to source lines 2 and drain lines 3.

Figure 2:
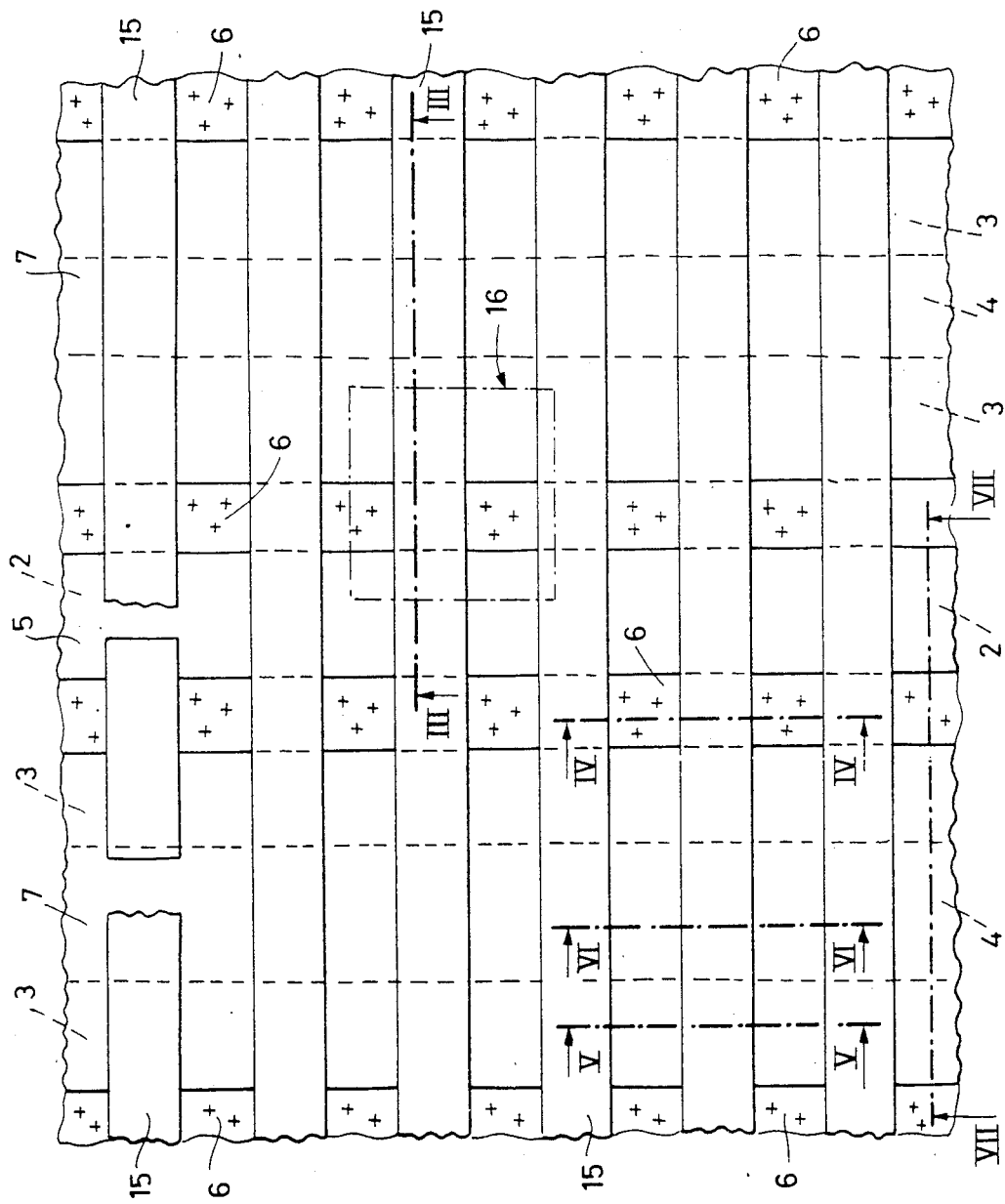
FIG. 2 is a plan view from above of a part of said matrix of memory cells.

The matrix is thus constituted by a plurality of EPROM memory cells arranged in a table cloth pattern, each of which is conformed like the one indicated with 16 (FIGS. 2 and 3), that is, it has a floating gate area 9 interposed between a source line 2 and drain line 3, and a control gate line 15 perpendicular to the source lines 2 and the drain lines 3, the floating gate 9 having two asymmetrical lateral fins 12 and 13 partially superimposed over the underlying oxide strips 5 and 7 and being interposed between a gate oxide area 8 and a layer of dielectric 14.

The oxide strips 5 and 7 have the task of increasing the distance between drain lines 3 and source lines 4 and the floating gate areas 9. In combination with the large contact surface between floating gate areas 9 and the oxide 5 and 7, obtained thanks to fins 12 and 13, this allows the attainment of an excellent capacitative coupling.

At the same time, since source lines 2 are alternated with two distinct drain lines 3 insulated from each other, each drain line 3 is common to only one row of cells 16, each of which is thus accessible through a traditional decoder, which is simpler and occupies a more limited space.

I claim:

1. A matrix of EPROM memory cells, comprising a semiconductor substrate, a plurality of first and second parallel strips of field oxide formed on the substrate, parallel source lines arranged in buried layers of the substrate under said first strips of field oxide, pairs of parallel drain lines arranged in buried layers of the substrate under each of said second strips of field oxide, floating gases interposed between said source lines and said drain lines and provided with lateral extensions superimposed over lateral portions of said first and second strips of field oxide, and control gate lines parallel to one another and perpendicular to said source and drain lines and superimposed on and aligned with said floating gate areas.

2. A matrix according to claim 1, wherein said first strips of field oxide are narrower than said second strips of field oxide.

* * * * *